(12) United States Patent
Sata et al.

(10) Patent No.: US 8,188,896 B2
(45) Date of Patent: May 29, 2012

(54) DIGITAL CONVERTER FOR PROCESSING RESOLVER SIGNAL

(75) Inventors: Kuniaki Sata, Kanagawa-ken (JP); Makoto Shinohara, Kanagawa-ken (JP); Eiji Sato, Kanagawa-ken (JP); Hajime Tsuchiya, Ibaraki-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 12/873,587

(22) Filed: Sep. 1, 2010

(65) Prior Publication Data

US 2011/0090104 A1   Apr. 21, 2011

(30) Foreign Application Priority Data

Oct. 20, 2009 (JP) ................. 2009-241243
Oct. 22, 2009 (JP) ................. 2009-243536

(51) Int. Cl.
*H03M 1/48* (2006.01)
(52) U.S. Cl. ......... 341/116; 318/144; 318/607; 341/155
(58) Field of Classification Search .......... 341/116–155; 318/144, 607
See application file for complete search history.

(56) References Cited

U.S. PATENT DOCUMENTS

| | | | |
|---|---|---|---|
| 5,260,650 A * | 11/1993 | Schwesig et al. | 324/163 |
| 7,123,175 B2 * | 10/2006 | Katakura et al. | 341/112 |
| 7,382,295 B2 * | 6/2008 | Otsuka et al. | 341/116 |
| 7,456,603 B2 * | 11/2008 | Kanekawa et al. | 318/807 |
| 2006/0132338 A1 * | 6/2006 | Katakura et al. | 341/112 |
| 2007/0146169 A1 * | 6/2007 | Otsuka et al. | 341/15 |

FOREIGN PATENT DOCUMENTS

| | | |
|---|---|---|
| JP | 2004077288 | 3/2004 |
| JP | 2005147729 | 6/2005 |
| JP | 2006343318 | 12/2006 |

* cited by examiner

*Primary Examiner* — Lam T Mai
(74) *Attorney, Agent, or Firm* — Turocy & Watson, LLP (57) ABSTRACT

According to one embodiment, a digital converter is provided to process output signals of a resolver attached to a rotating apparatus. These output signals are converted into digital signals by ΔΣ AD converters. Multiplication units receive the digital signals outputted from the ΔΣ AD converters. A subtraction unit subtracts the outputs of the multiplication units. A synchronous detection unit detects the output of the subtraction unit based on a synchronization signal synchronously. An angular velocity calculation unit adjusts a proportional gain of an output of the synchronous detection unit, compensates the phase thereof, and calculates the angular velocity of the rotating apparatus. A rotational angle calculation unit calculates a rotational angle by integrating the angular velocity. Cosine and sine output units output a cosine and a sine corresponding to the obtained rotational angle to the multiplication units, respectively.

14 Claims, 10 Drawing Sheets

DIGITAL CONVERTER FOR PROCESSING RESOLVER SIGNAL

CROSS-REFERENCE TO RELATED APPLICATION(S)

This application is based upon and claims the benefit of priority from Japanese Patent Application No. 2009-241243 filed on Oct. 20, 2009 and Japanese Patent Application No. 2009-243536 filed on Oct. 22, 2009, the entire contents of which are incorporated herein by reference.

FIELD

Embodiments described herein relate generally to a digital converter for processing a signal from a resolver attached to a rotating apparatus.

BACKGROUND

A resolver is widely used to detect a rotational angle of a rotating apparatus such as a rotor of a motor. When a sine wave excitation signal $\sin \omega t$ is inputted to the resolver, it outputs two output signals obtained by amplitude-modulating the excitation signal according to a rotational angle $\theta$ of a rotating apparatus. The excitation signal means a magnetic energization signal. The two output signals are an alternating current signal $\sin \theta \cdot \sin \omega t$ and an alternating current signal $\cos \theta \cdot \sin \omega t$, where t is time.

A digital converter calculates the alternating current signals $\sin \theta \cdot \sin \omega t$, $\cos \theta \cdot \sin \omega t$ which are inputted from the resolver, and outputs an output angle $\phi$ as digital data. Japanese Patent Application Publication No. 2008-219756 (page 4, FIG. 1) discloses a tracking-type digital converter. In the digital converter, an output angle $\phi$ is fed back to an input side, and a control deviation $\epsilon = \sin(\theta - \phi)$ is generated. The output angle $\phi$ is controlled so that the control deviation $\epsilon$ may become zero.

The control deviation $\epsilon$ is generated as follows. Values of $\cos \phi$ and $\sin \phi$ corresponding to the output angle $\phi$ are read from a table. The input signal $\sin \theta \cdot \sin \omega t$ and the input signal $\cos \theta \cdot \sin \omega t$ are multiplied by the $\cos \phi$ and $\sin \phi$, respectively. Then, one of the two signals obtained by the multiplication are subtracted from the other, and $\sin(\theta - \phi) \cdot \sin \omega t$ is calculated according to the following expression.

$$(\sin\theta \cdot \sin\omega t) \cdot \cos\phi - (\cos\theta \cdot \sin\omega t) \cdot \sin\phi =$$
$$(\sin\theta \cdot \cos\phi - \cos\theta \cdot \sin\phi)\sin\omega t = \sin(\theta - \phi) \cdot \sin\omega t$$

The obtained signal $\sin(\theta - \phi) \cdot \sin \omega t$ is synchronously detected using a synchronization clock generated from the excitation signal $\sin \omega t$. As a result, the excitation signal component is removed from the obtained signal $\sin(\theta - \phi) \cdot \sin \omega t$, and the control deviation $\epsilon$ is obtained.

A data sheet of Analog Devices, Inc. having the URL shown below discloses a digital converter which converts two inputted signals $\sin \theta \cdot \sin \omega t$ and $\cos \theta \cdot \sin \omega t$ from analog to digital and performs the entire signal processing after the conversion digitally.
http://www.analog.com/static/imported-files/jp/data_sheets/AD2S1205_jp.pdf>

The above analog-to-digital conversion may be performed using a successive approximation AD converter of 10 to 12 bits, for example. In general, the successive approximation AD converter has a low conversion speed of approximately 2 to 8 μs. When a position of a rotational object whose rotational angle is to be detected is changed during the analog-to-digital conversion processing, a large error may occur between the actual rotational angle $\theta$ of the rotational object and the output angle $\phi$ of the digital converter.

Moreover, the successive approximation AD converter includes an analog element such as an analog comparator in the interior so that it causes difficulty in increasing the number of bits in order to achieve a higher precision.

Accordingly, such a digital converter has difficulty in performing signal processing at high speed and with high precision.

Further, in such a digital converter, the control deviation $\epsilon = \sin(\theta - \phi)$ obtained by the synchronous detection can be regarded almost as $\epsilon = (\theta - \phi)$ when $(\theta - \phi)$ is small. An angular velocity v can be obtained by integrating the control deviation $\epsilon$. The output angle $\phi$ can be obtained by further integrating the angular velocity v. Then, $\cos \phi$ and $\sin \phi$ corresponding to the output angle $\phi$ are read from the table, and the obtained $\cos \phi$ and $\sin \phi$ are fed back to an input side. Such a feedback loop requires two integrator units. In a case where the feedback loop is composed of the integrator units only, the feedback control system may become unstable.

On the other hand, when a delay time exists between the excitation signal and the alternating current signal from the resolver, the phase of the synchronization detection may be shifted, and the sensitivity of the synchronous detection may be reduced. As a result, an error occurs in calculation of the rotational angle, and the precision of the outputted data of the rotational angle is lowered.

Japanese Patent Application Publication No. 2005-147729 (pages 3 to 6, FIG. 1) discloses a digital converter which improves the problem caused by the above-described delay time. This digital converter calculates a delay time of an alternating current signal outputted from the resolver. Based on the calculated delay time, a calculated rotational angle is corrected.

However, in the above digital converter, the delay time of the alternating current signal is calculated only when the resolver is halted. Therefore, in the case where the delay time is changed due to a change of temperature, for example, while the resolver operates, correction of the rotational angle is difficult in accordance with the change of the delay time.

DETAILED DESCRIPTION

According to one embodiment, a digital converter is provided to process two output signals of a resolver attached to a rotating apparatus. These two output signals are converted into digital signals by first and second ΔΣ AD converters. First and second multiplication units receive the digital signals outputted from the first and second ΔΣ AD converters. A subtraction unit subtracts outputs of the first and second multiplication units. A synchronous detection unit synchronously detects the output of the subtraction unit based on a synchronization signal. An angular velocity calculation unit adjusts a proportional gain of an output of the synchronous detection unit, compensates the phase of the output of the synchronous detection unit, and calculates the angular velocity of the rotating apparatus. A rotational angle calculation unit calculates the rotational angle of the rotating apparatus by integrating the angular velocity. A cosine output unit and a sine output unit output a cosine and a sine corresponding to the obtained rotational angle to the first and second multiplication units, respectively.

According to another embodiment, a digital converter is provided to process two output signals of a resolver attached to a rotating apparatus. An excitation signal generation unit generates an excitation signal to be provided to the resolver. First and second AD converters converts the two output signals into digital signals, respectively. First and second multiplication units receive the digital signals outputted from the first and second AD converters, respectively.

A subtraction unit subtracts outputs of the first and second multiplication units. A synchronous detection unit detects the output of the subtraction unit synchronously. An angular velocity calculation unit adjusts a proportional gain of an output of the synchronous detection unit, compensates the phase of the output of the synchronous detection unit, and calculates the angular velocity of the rotating apparatus. A rotational angle calculation unit calculates the rotational angle of the rotating apparatus by integrating the angular velocity.

A cosine output unit and a sine output unit outputs a cosine and a sine corresponding to the obtained rotational angle to the first and second multiplication units, respectively. A measurement unit measures phase delay time of the signals corresponding to the two output signals of the resolver with respect to the excitation signal. A variable delay unit delays the excitation signal according to the phase delay time calculated by the measurement unit, and inputs the delayed excitation signal to the synchronous detection unit as a synchronization signal.

Hereinafter further embodiments will be described with reference to the drawings. In the drawings, the same reference numerals denote the same or similar portions.

A first embodiment will be described with reference to FIG. 1.

Figure 1:
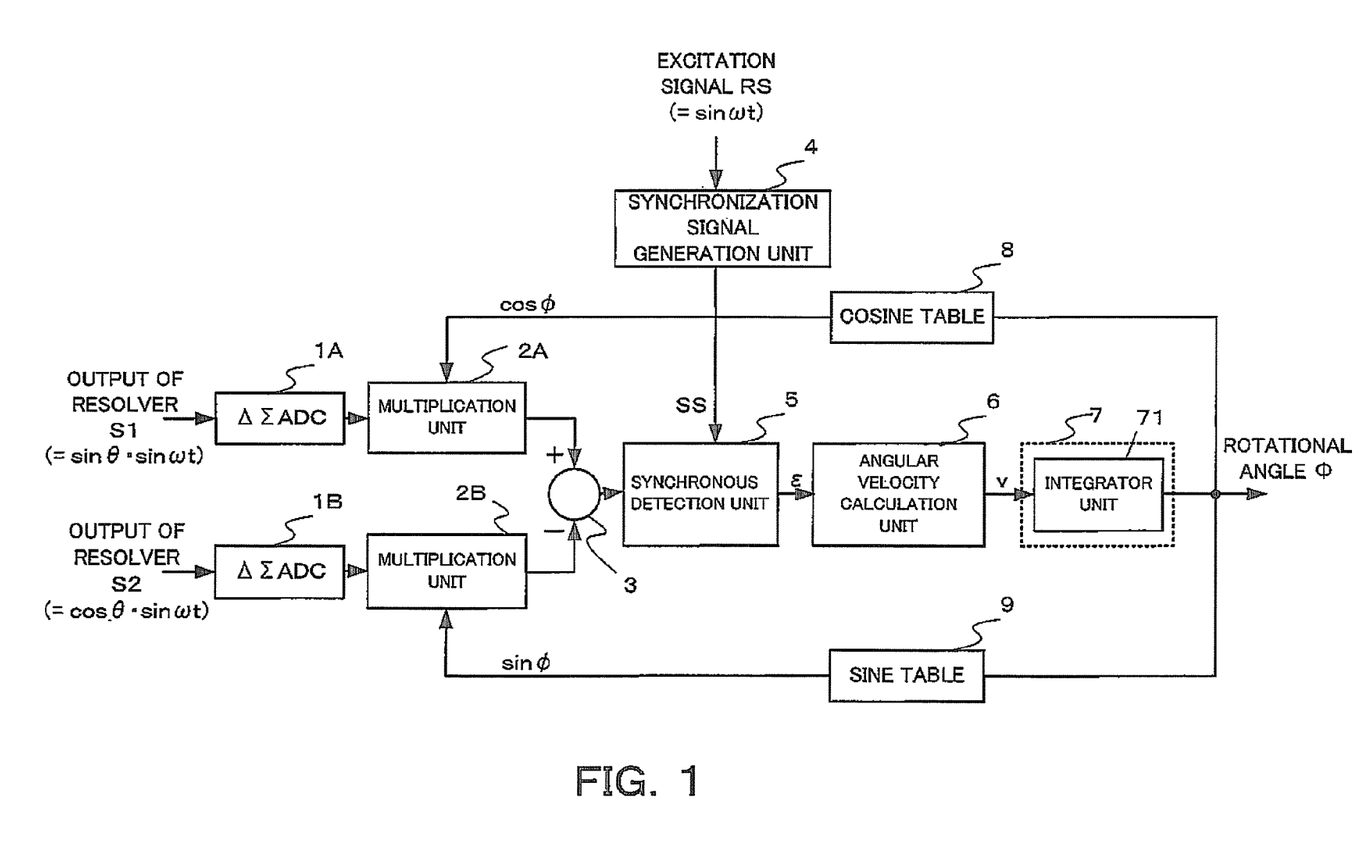
FIG. 1 is a block diagram illustrating a structure of a digital converter according to a first embodiment.

FIG. 1 is a block diagram illustrating an example of a structure of a digital converter according to the first embodiment.

As shown in FIG. 1, the digital converter according to the embodiment is provided with ΔΣ AD (Analog-Digital) converters 1A, 1B, multiplication units 2A, 2B, a subtraction unit 3, a synchronization signal generation unit 4, a synchronous detection unit 5, an angular velocity calculation unit 6, a rotational angle calculation unit 7, a cosine table 8 serving as a cosine output unit, and a sine table 9 serving as a sine output unit.

The AD converters 1A, 1B respectively receive output signals S1, S2, i.e., alternating current signals sent from a resolver attached to a rotating apparatus. The multiplication units 2A, 2B receive outputs from the ΔΣ AD converters 1A, 1B. The subtraction unit 3 subtracts the output of the multiplication unit 2B from the output of the multiplication unit 2A. The synchronization signal generation unit 4 generates a synchronization signal SS based on an excitation signal RS to be given to the resolver. The synchronous detection unit 5 detects the output of the subtraction unit 3 synchronously, using the synchronization signal SS.

The angular velocity calculation unit 6 calculates an angular velocity v of the rotating apparatus from the output of the synchronous detection unit 5. The rotational angle calculation unit 7 calculates the rotational angle $\phi$ of the rotating apparatus by causing an integrator unit 71 to integrate the angular velocity v calculated by the angular velocity calculation unit 6. The cosine table 8 outputs a cosine function value $\cos\phi$ of the calculated rotational angle $\phi$ to the multiplication unit 2A. The sine table 9 outputs a sine function value $\sin\phi$ of the calculated rotational angle $\phi$ to the multiplication unit 2B.

Figure 2:
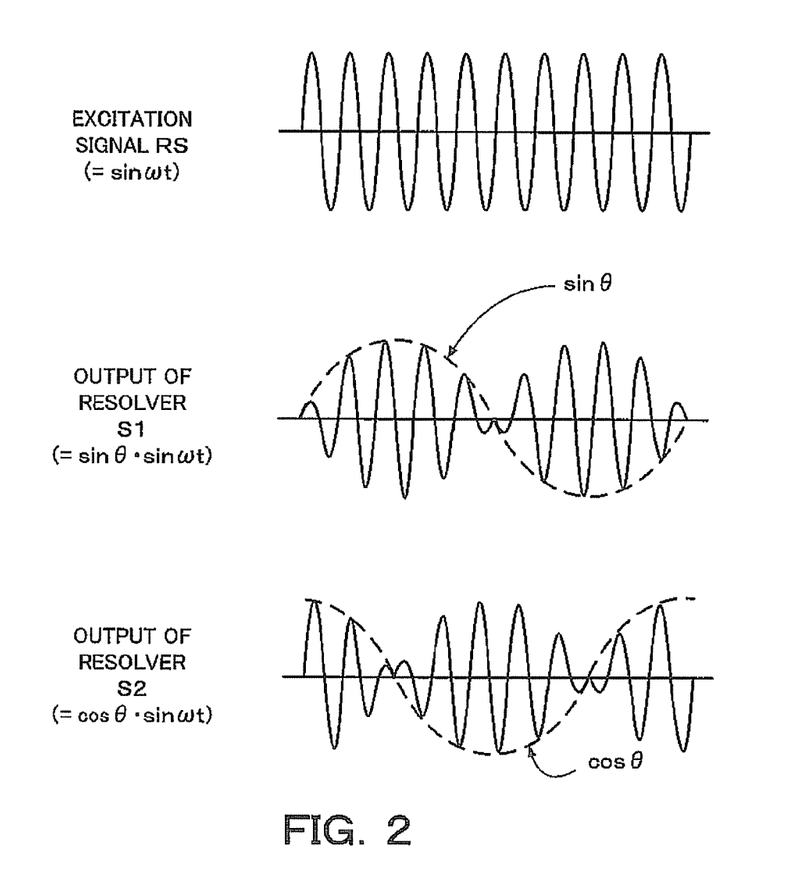
FIG. 2 is a diagram illustrating examples of input/output signal waveforms of a resolver.

FIG. 2 illustrates an example of the signal waveform of the excitation signal RS inputted to the resolver, and illustrates examples of the signal waveforms of the outputs S1, S2 from the resolver.

FIG. 2 shows the case where a sine wave signal $\sin\omega t$ represented by an angular frequency $\omega$ and a time t is inputted as the excitation signal RS.

When the sine wave signal $\sin\omega t$ is inputted to the resolver, as the excitation signal RS, the excitation signal RS is amplitude-modulated so that output signals S1, S2 are obtained from the resolver according to the rotational angle $\theta$ of the rotating apparatus. The output signals S1, S2 are shown by the following expressions.

$$S1 = \sin\theta \cdot \sin\omega t$$

$$S2 = \cos\theta \cdot \sin\omega t$$

The output signals S1, S2 of the resolver are inputted to the ΔΣ AD converters 1A, 1B, respectively, and are converted into digital signals.

Figure 3:
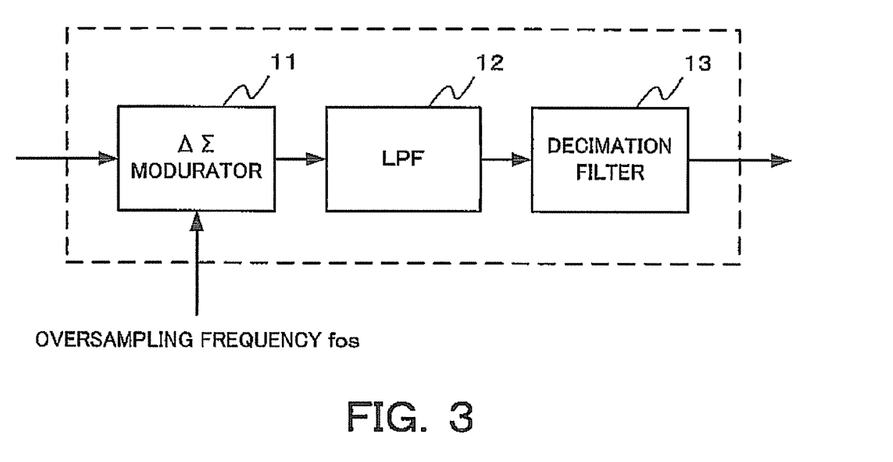
FIG. 3 is a block diagram illustrating an example of a structure of a $\Delta\Sigma$ AD converter.

FIG. 3 illustrates an example of a structure of the ΔΣ AD converters 1A, 1B.

The example is provided with a ΔΣ modulator 11, a low-pass filter 12, and a decimation filter 13. The ΔΣ modulator 11 samples an inputted analog signal using an oversampling frequency fos which is larger than an original sampling frequency, and outputs a pulse density modulation signal of a high speed. The low-pass filter 12 removes a high frequency noise from the output of the ΔΣ modulator 11. The decimation filter 13 decimates the output data of the low-pass filter 12, and outputs data having the original sampling rate.

The number of output bits of the ΔΣ AD converters 1A, 1B is determined by a decimation ratio of the decimation filter 13, i.e., an oversampling ratio which is a ratio between the oversampling rate of the ΔΣ modulator 11 and the original sampling rate.

For example, in the case that the oversampling ratio is 16, the output of the of ΔΣ AD converters 1A, 1B can be 16 bits.

When the oversampling ratio is further increased, the number of output bits can be increased more.

In FIG. 1, the output of the of ΔΣ AD converter 1A is inputted to the multiplication unit 2A. Then, the multiplication unit 2A multiplies the output of the ΔΣ AD converter 1A by the cosine function value cos φ. The cosine function value cos φ corresponds to the rotational angle φ calculated previously and is feedback inputted from the cosine table 8. The multiplication unit 2A outputs (sin θ·sin ωt)·cos φ.

On the other hand, the output of the of ΔΣ AD converter 1B is inputted to the multiplication unit 2B. Then, the multiplication unit 2B multiplies the output of the ΔΣ AD converter 1B by the sine function value sin φ. The sine function value sin φ corresponds to the rotational angle φ calculated previously and is feedback inputted from the sine table 9. The multiplication unit 2B outputs (cos θ·sin ωt)·sin φ.

The subtraction unit 3 subtracts the output of the multiplication unit 2B from the output of the multiplication unit 2A, and outputs sin(θ−φ)·sin ωt as follows.

$$(\sin\theta \cdot \sin\omega t) \cdot \cos\phi - (\cos\theta \cdot \sin\omega t) \cdot \sin\phi =$$

$$(\sin\theta \cdot \cos\phi - \cos\theta \cdot \sin\phi)\sin\omega t = \sin(\theta - \phi) \cdot \sin\omega t$$

Figure 4:
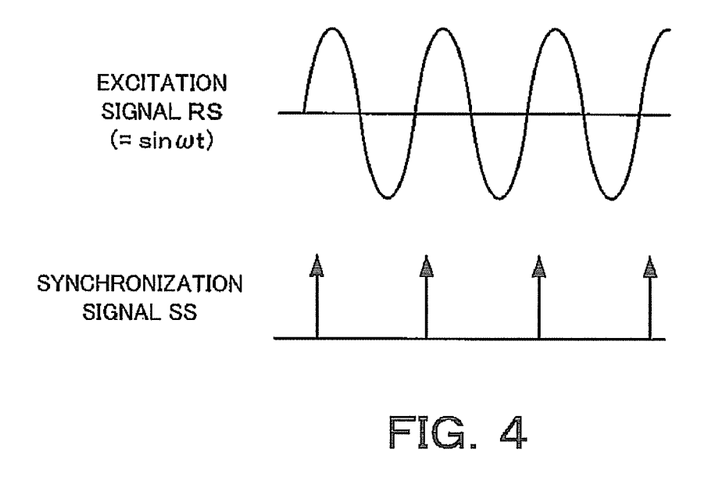
FIG. 4 is a waveform diagram illustrating relationship between an excitation signal and a synchronization signal.

The synchronization signal generation unit 4 generates the synchronization signal SS based on the excitation signal RS to be inputted to the resolver. FIG. 4 illustrates a relationship between the excitation signal RS and the synchronization signal SS. The synchronization signal SS is a timing pulse signal outputted in each cycle of the excitation signal RS. The synchronization signal SS includes a series of pulses which are produced respectively after a constant time period from zero points of the excitation signal RS. The reason for avoiding the zero points of the excitation signal RS is to prevent the outputs S1, S2 of the resolver from becoming zero and to avoid that detection of the rotational angle φ is incapable. For example, each of the pulses of the timing pulse signal can be produced by detecting that the excitation signal RS is a sufficiently large positive or negative value.

In FIG. 1, the synchronous detection unit 5 samples the output of the subtraction unit 3 using the synchronization signal SS, and synchronously detects the output in synchronization with the excitation signal RS. As a result, the component of the excitation signal RS is removed from the output of the subtraction unit 3, and the synchronous detection unit 5 outputs sin(θ−φ).

When (θ−φ) is small, sin(θ−φ)≈(θ−φ) is established. The (θ−φ) is a control deviation ε for achieving φ=θ. Accordingly, the output of the synchronous detection unit 5 can be regarded as the control deviation ε as follows.

$$\epsilon \approx \sin(\theta - \phi)$$

The angular velocity calculation unit 6 calculates the angular velocity v of a rotating body of the rotating apparatus by integrating the control deviation ε. The rotational angle calculation unit 7 calculates the rotational angle φ of the rotating apparatus by causing the integrator unit 71 to integrate the angular velocity v calculated by the angular velocity calculation unit 6.

In a case where the angular velocity calculation unit 6 is composed of an integrator unit only, the integrator unit alone gives the feedback gain of the feedback loop constituted by the angular velocity calculation unit 6, the rotational angle calculation unit 7, and the cosine table 8 or the sine table 9. Accordingly, the system may become unstable due to oscillation at a specific frequency, for example.

In the embodiment, a feedback gain of a proportional element is inserted into the angular velocity calculation unit 6, so as to stabilize the system.

Figure 5:
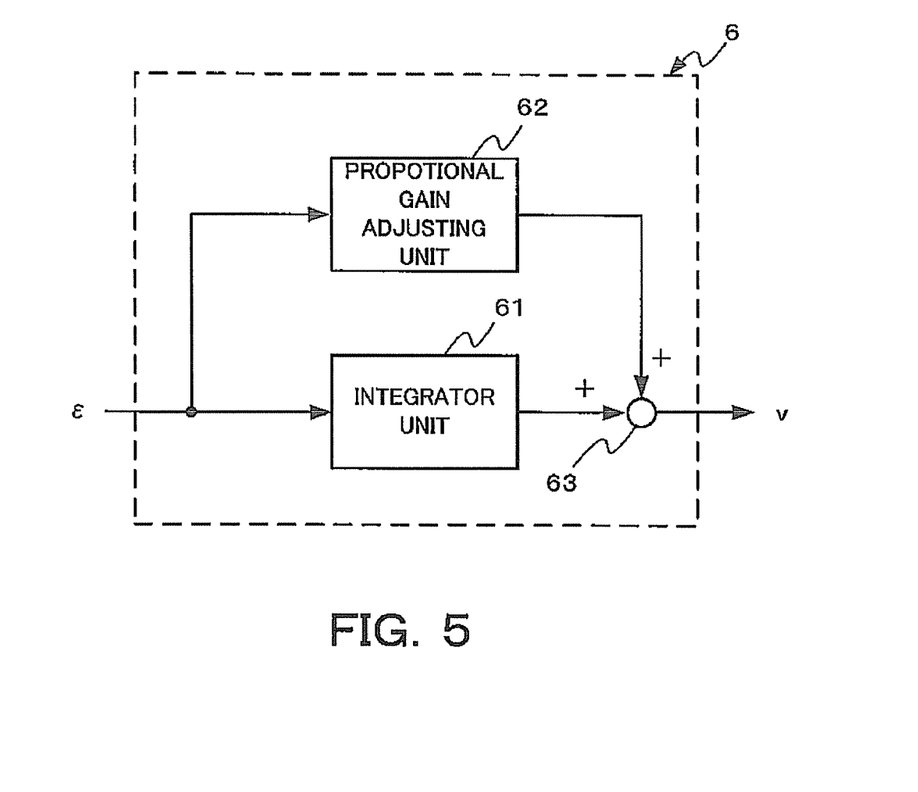
FIG. 5 is a block diagram illustrating an example of a structure of an angular velocity calculation unit of the digital converter according to the first embodiment.

FIG. 5 is an example of the structure of the angular velocity calculation unit 6.

As shown in FIG. 5, the angular velocity calculation unit 6 includes an integrator unit 61, a proportional gain adjusting unit 62, and an adding unit 63. The integrator unit 61 integrates the received control deviation ε. The proportional gain adjusting unit 62 adjusts the proportional gain with respect to the control deviation ε. The adding unit 63 adds the output of the integrator unit 61 and the output of the proportional gain adjusting unit 62, and outputs the angular velocity v.

Figure 6:
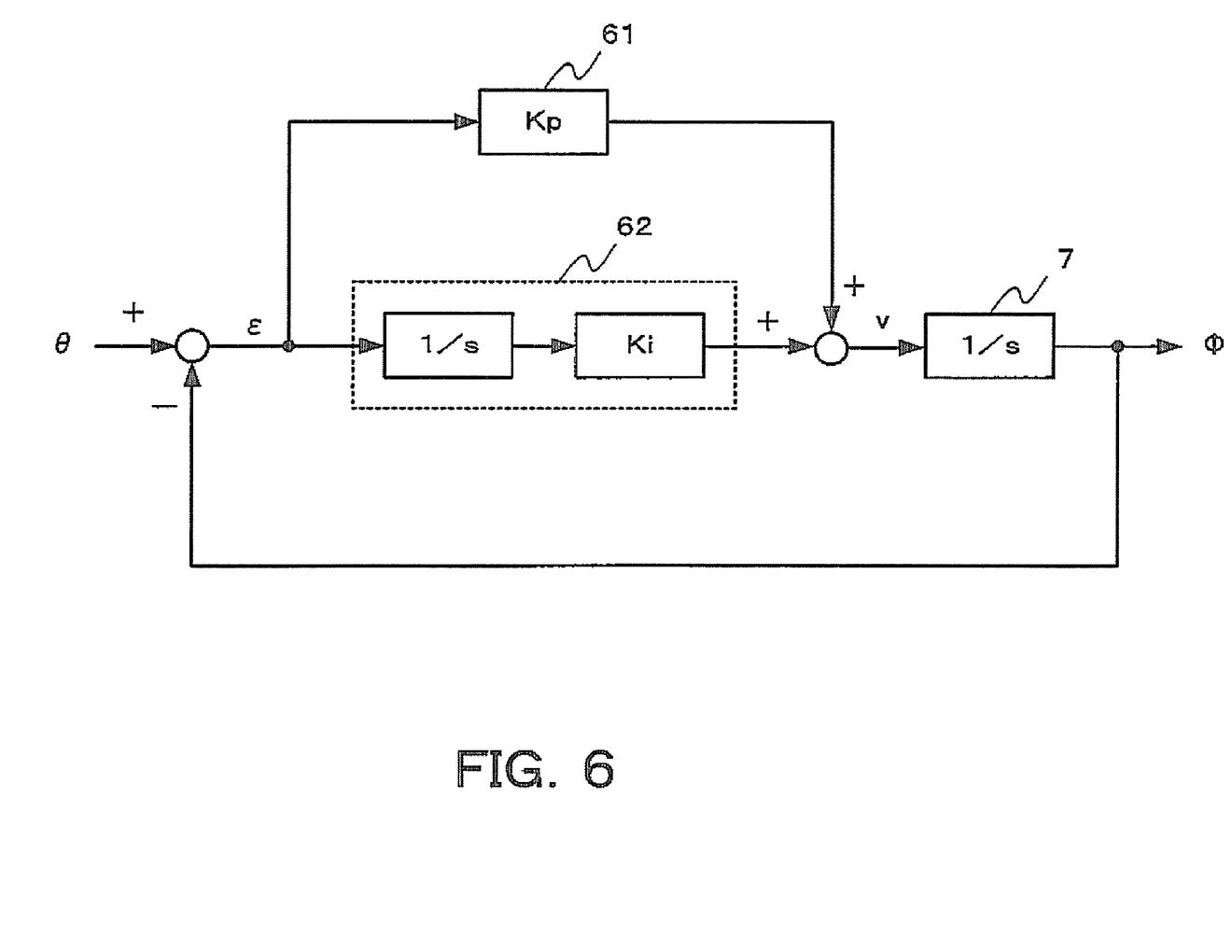
FIG. 6 is a block diagram illustrating a feedback loop of the digital converter according to the first embodiment, using transfer functions.

FIG. 6 is a block diagram illustrating the feedback loop of the digital converter according to the embodiment, using transfer functions.

A transfer function K(s) of the control system shown in FIG. 6 is represented as the following expression.

$$K(s) = (Kp + Ki/s) \cdot 1/s$$

In the angular velocity calculation unit 6 according to the embodiment, the integrator unit 61 detects angular velocity, and the proportional gain adjusting unit 62 performs phase compensation. The angular velocity calculation unit 6 performs a PI control (proportional plus integration control). Therefore, the feedback loop according to the embodiment can operate stably.

According to the embodiment described above, the ΔΣ AD converter converts the signal inputted from the resolver into digital data. Accordingly, the conversion speed of the analog to digital conversion can be increased to about 1 µs. Therefore, the error between the actual rotational angle θ of the rotor of the motor and the outputted rotational angle φ can be reduced, compared with a slow successive approximation AD converter. Further, the ΔΣ AD converter enables analog to digital conversion with a high precision of 16 bits or more.

As described above, a fast analog to digital conversion is performed with high precision. Therefore, the processing from the analog to digital conversion to the calculation of the rotational angle can also be performed fast with high precision. Further, since the feedback loop for calculating the rotational angle is a PI control, a stable operation can be performed.

Figure 7:
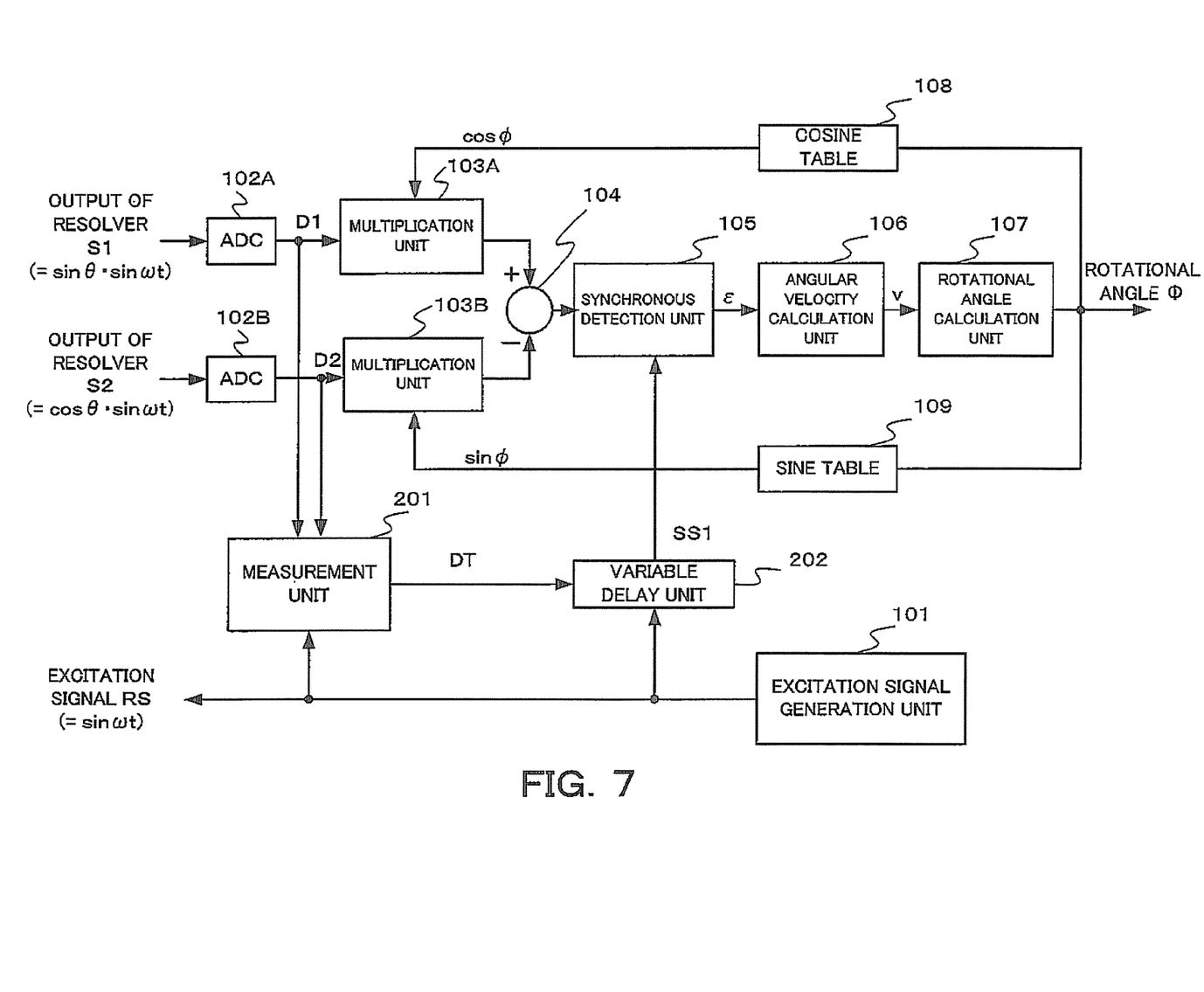
FIG. 7 is a block diagram illustrating an example of a structure of a digital converter according to a second embodiment.

FIG. 7 is a block diagram illustrating an example of a structure of a digital converter according to a second embodiment.

As shown in FIG. 7, the digital converter according to the embodiment includes an excitation signal generation unit 101, AD converters 102A, 102B, multiplication units 103A, 103B, a subtraction unit 104, a synchronous detection unit 105, an angular velocity calculation unit 106, a rotational angle calculation unit 107, a cosine table 108 serving as a cosine output unit, and a sine table 109 serving as a sine output unit.

The excitation signal generation unit 101 generates an excitation signal RS to be provided to a resolver attached to a rotating apparatus. The AD converters 102A, 102B receive outputs S1, S2 from the resolver respectively. The multiplication units 103A, 103B receive an output D1 of the AD converter 102A and an output D2 of the AD converter 102B, respectively. The subtraction unit 104 subtracts the output of the multiplication unit 103B from the output of the multiplication unit 103A. The synchronous detection unit 105 detects the output of the subtraction unit 104 synchronously, using a synchronization signal SS based on the excitation signal RS.

The angular velocity calculation unit 106 calculates an angular velocity v of the rotating apparatus by integrating the output of the synchronous detection unit 105. The rotational angle calculation unit 107 calculates a rotational angle φ of the rotating apparatus by integrating the angular velocity v calculated by the angular velocity calculation unit 106. The cosine table 108 outputs a cosine function value cos φ of the rotational angle φ calculated by the rotational angle calculation unit 107 to the multiplication unit 103A. The sine table 109 outputs a sine function value sin φ of the rotational angle φ calculated by the rotational angle calculation unit 107 to the multiplication unit 103B.

Figure 8:
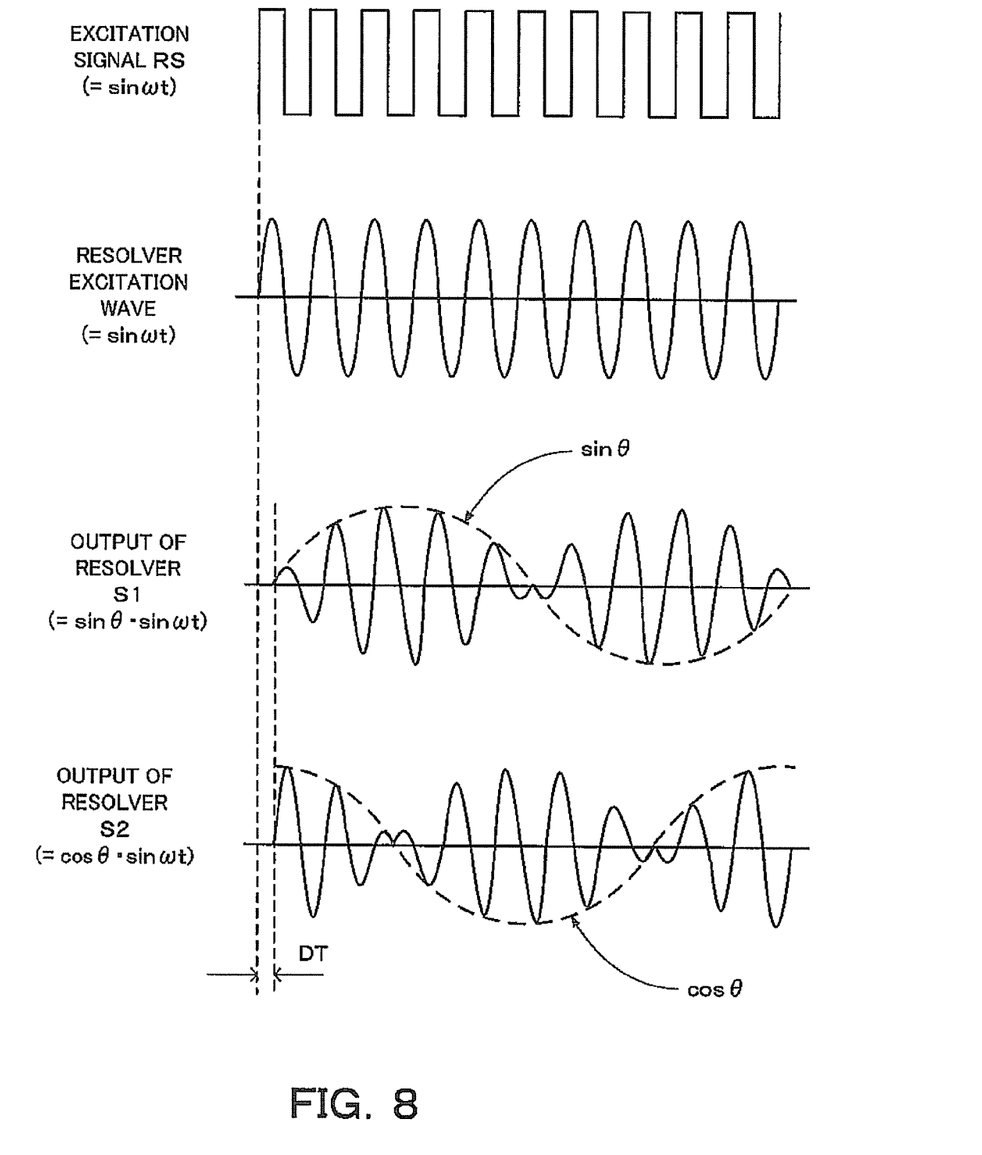
FIG. 8 is a diagram illustrating relationship between an alternating current signal outputted from the resolver and an excitation signal outputted from the digital converter according to the second embodiment.

FIG. 8 illustrates relationship between a waveform of the excitation signal RS generated by the excitation signal generation unit 101, a resolver excitation wave, and waveforms of the output signals S1, S2 outputted from the resolver. The excitation signal RS is a rectangular wave. The excitation signal RS is converted into a sine wave sin ωt by an external filter (not shown), and is provided to the resolver as the excitation wave.

The following two output signals S1, S2 are outputted from the resolver. The output signals S1, S2 are obtained by amplitude-modulating the excitation wave sin ωt according to the rotational angle θ of the rotating apparatus.

$$S1 = \sin\theta \cdot \sin\omega t$$

$$S2 = \cos\theta \cdot \sin\omega t$$

In this case, a phase delay occurs between the excitation signal RS and the output signals S1, S2 of the resolver due to operation time of the resolver or signal transmission time between the resolver and the digital converter. The phase delay time is denoted as DT in FIG. 8.

The output signals S1, S2 of the resolver are inputted to the AD converters 102A, 102B, respectively, and are converted into digital signals.

The output signal D1 of the AD converter 102A is inputted to the multiplication unit 103A. Then, the multiplication unit 103A multiplies the output signal D1 by a cosine function value cos φ, which corresponds to the rotational angle φ calculated previously and is feedback inputted from the cosine table 108. As a result, the multiplication unit 103A outputs (sin θ·sin ωt)·cos φ.

On the other hand, the output signal D2 of the AD converter 102B is inputted to the multiplication unit 103B. Then, the multiplication unit 103B multiplies the output signal D2 by a sine function value sin φ, which corresponds to the rotational angle φ calculated previously and is feedback inputted from the sine table 109. As a result, the multiplication unit 103B outputs (cos θ·sin ωt)·sin φ.

The subtraction unit 104 subtracts the output signal of the multiplication unit 103B from the output signal of the multiplication unit 103A, and outputs a signal sin(θ−φ)·sin ωt as follows.

$$(\sin\theta \cdot \sin\omega t) \cdot \cos\phi - (\cos\theta \cdot \sin\omega t) \cdot \sin\phi =$$
$$(\sin\theta \cdot \cos\phi - \cos\theta \cdot \sin\phi)\sin\omega t = \sin(\theta - \phi) \cdot \sin\omega t$$

The synchronous detection unit 105 samples the output of the subtraction unit 104 using the synchronization signal SS, and detects the output synchronously in synchronization with the excitation signal RS. The component of the excitation signal RS is removed from the output signal of the subtraction unit 104 as a result of the synchronous detection, and the synchronous detection unit 105 outputs sin(θ−φ).

When (θ−φ) is small, sin(θ−φ)≈(θ−φ) is established. The (θ−φ) is a control deviations for achieving φ=θ. Accordingly, the output of the synchronous detection unit 105 may be regarded as the control deviation ε≈sin(θ−φ).

The angular velocity calculation unit 106 calculates the angular velocity v of the rotating apparatus by integrating the control deviation ε. The rotational angle calculation unit 107 calculates the rotational angle φ of the rotating apparatus by integrating the angular velocity v calculated by the angular velocity calculation unit 106.

The digital converter according to the embodiment outputs the rotational angle φ as the calculation result according to the rotational angle θ of the rotating apparatus.

As described above, the synchronous detection unit 105 performs the synchronous detection in order to remove the excitation signal component included in the output signals S1, S2 given by the resolver. The phase difference of the phase delay time DT occurs between the excitation signal RS and the output signals S1, S2 given by the resolver as shown in FIG. 8.

As a result, if the synchronous detection is performed using the excitation signal RS, the phase of the synchronous detection is shifted, and the sensitivity of the synchronous detection is lowered. As a result, an error may occur in calculating the rotational angle, and the precision of outputted data of the rotational angle is deteriorated.

As shown in FIG. 7, a measurement unit 201 and a variable delay unit 202 are arranged in the embodiment. The measurement unit 201 measures the phase delay time between the excitation signal RS and the output signal S1 or S2 of the resolver. The variable delay unit 202 delays the excitation signal RS by a time period corresponding to the phase delay time DT calculated by the measurement unit 201. The variable delay unit 202 outputs the delayed excitation signal RS as a synchronization signal SS1 which is inputted to the synchronous detection unit 105.

Figure 9:
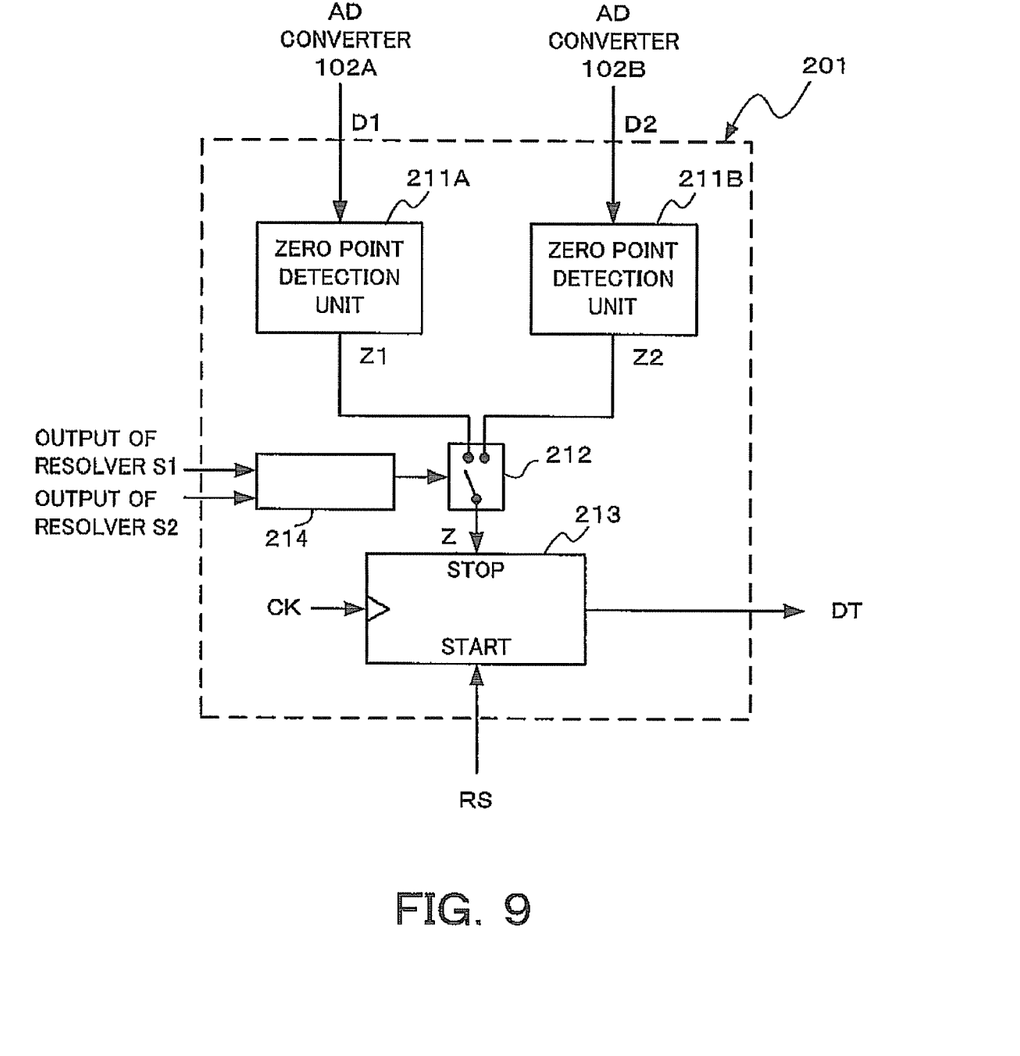
FIG. 9 is a block diagram illustrating an example of a structure of a measurement unit arranged in the digital converter according to the second embodiment.

FIG. 9 illustrates an example of a structure of the measurement unit 201.

As shown in FIG. 9, the measurement unit 201 is provided with zero point detection units 211A, 211B, a switch 212, and a counter 213.

The zero point detection unit 211A detects a zero point of an amplitude level of the output signal D1 outputted from the AD converter 102A corresponding to the output S1 signal given by the resolver, and outputs a zero point detection signal Z1. The zero point detection unit 211B detects a zero point of an amplitude level of the output signal D2 outputted from the AD converter 102B corresponding to the output signal S2 given by the resolver, and outputs a zero point detection signal Z2. The switch 212 outputs one of the zero point detection signal Z1, Z2 selectively as a zero point detection signal Z according to a switching signal from a control unit 214.

The control unit 214 compares the outputs S1, S2 from the resolver, and selects one of the zero point detection signals Z1, Z2 based on one of the output signal D1, D2 of the AD converter 102A, 102B which corresponds to one of the outputs S1, S2 indicating a larger amplitude.

The counter 213 starts counting at a rising edge of the excitation signal RS, and stops counting when the zero point detection signal Z is outputted. The counter 213 performs counting based on a high frequency clock signal CK. The counter 213 outputs a count value obtained by counting from the start of counting to the end of counting, as the phase delay time DT.

Figure 10:
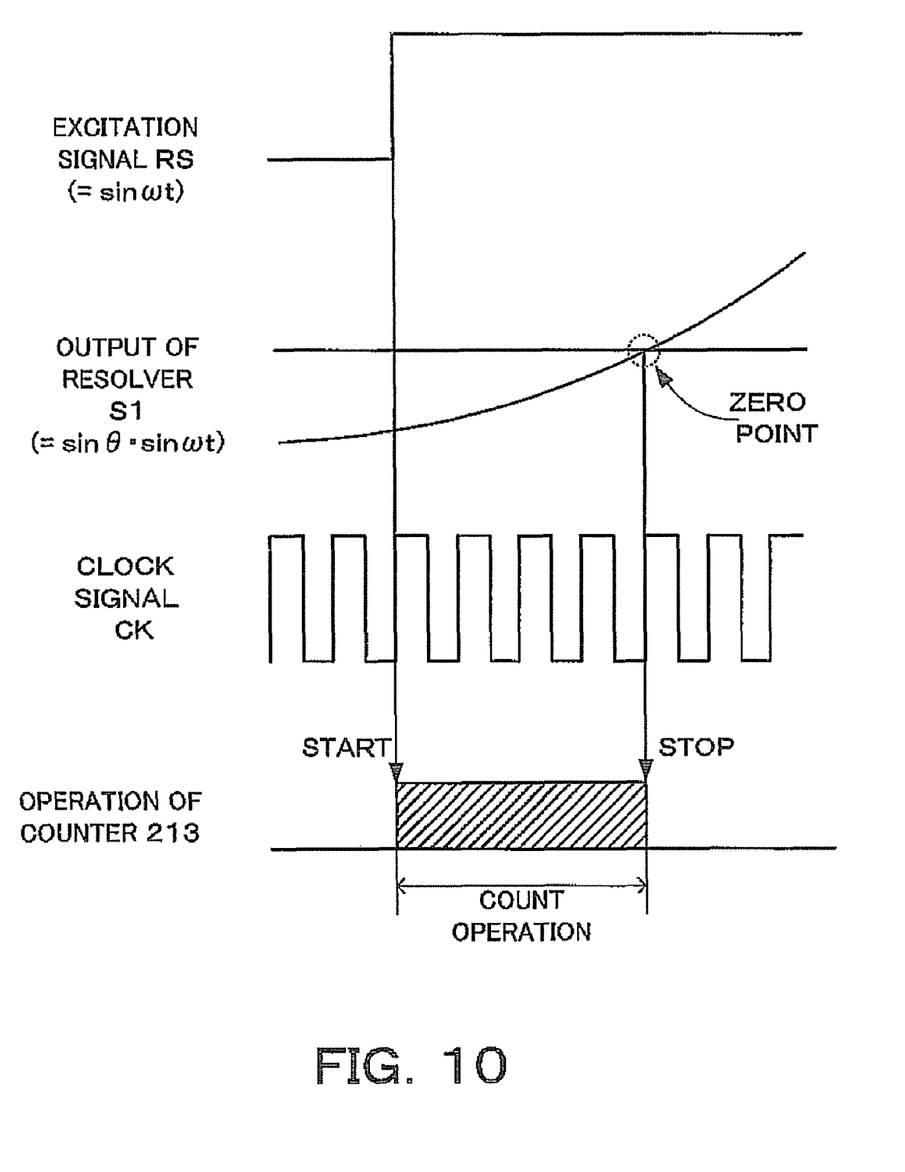
FIG. 10 is an explanatory diagram illustrating operation of the measurement unit shown in FIG. 9.

FIG. 10 illustrates operation timing of the measurement unit 1 shown in FIG. 9.

The counter 213 starts counting in response to the rising edge of the excitation signal RS, and stops counting when a zero point of an amplitude level of the output S1 of the resolver is detected, for example.

An analog waveform of the resolver output signal S1 is illustrated in FIG. 10 for easy understanding of zero point detection. However, actually, the zero point detection unit 211A performs zero point detection by detecting whether the output D1 of the AD converter 102A is zero or not.

Both of the output signal S1 and the output signal S2 of the resolver have the same phase delay time DT with respect to the excitation signal RS. Therefore, the phase delay time DT can be basically measured by detecting a zero point of any one of the output signal S1 and the output signal S2 of the resolver.

In the embodiment, the zero point detection is performed while switching the outputs S1, S2 of the resolver. The reason why the zero point detection is performed for both of the outputs S1, S2 of the resolver will be described below.

Figure 11:
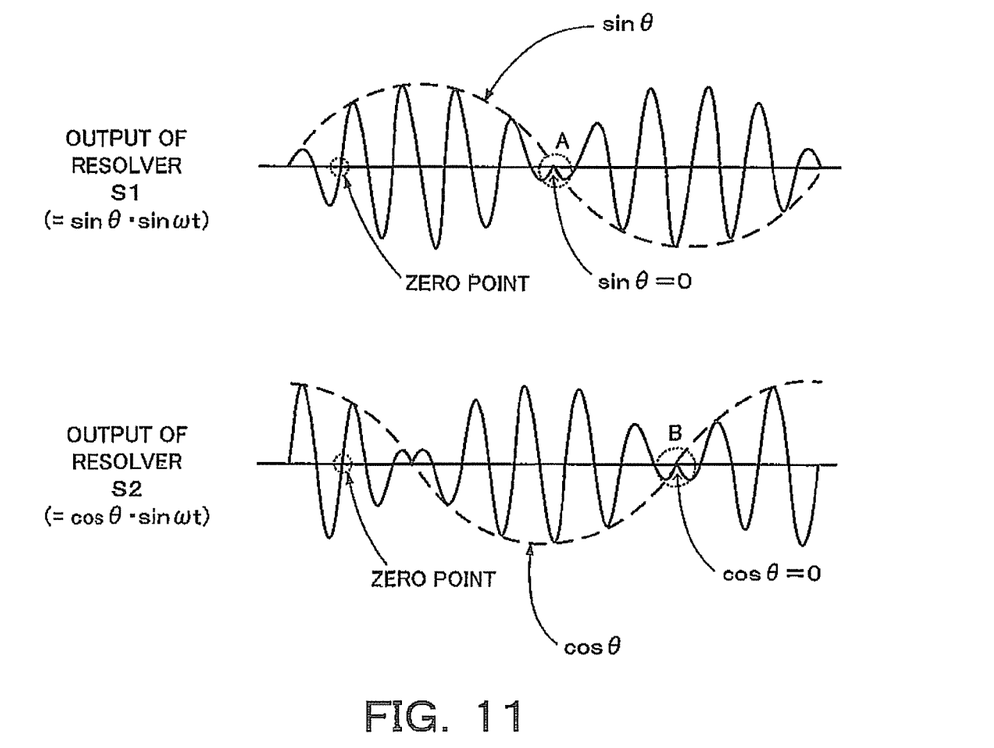
FIG. 11 is a diagram illustrating zero points of the alternating current signals outputted from the resolver.

As shown in FIG. 11, the signal level of the output signal S is extremely small in proximity to a portion A at which sin θ=0 is established. The signal level of the output signal S2 is extremely small in proximity to a portion B at which cos θ=0 is established. Therefore, in proximity to the portions A, B, errors are likely to occur in the zero point detection.

A phase difference of 90 degrees exists between the signal sin θ·sin ωt and the signal cos θ·sin ωt that are outputted from the resolver. Further, sin θ=0 and cos θ=0 can not occur at the same time.

Thus, in the embodiment, the zero point detection is performed for both of the outputs S1, S2 of the resolver, and prevents errors from occurring in the zero point detection.

Figure 12:
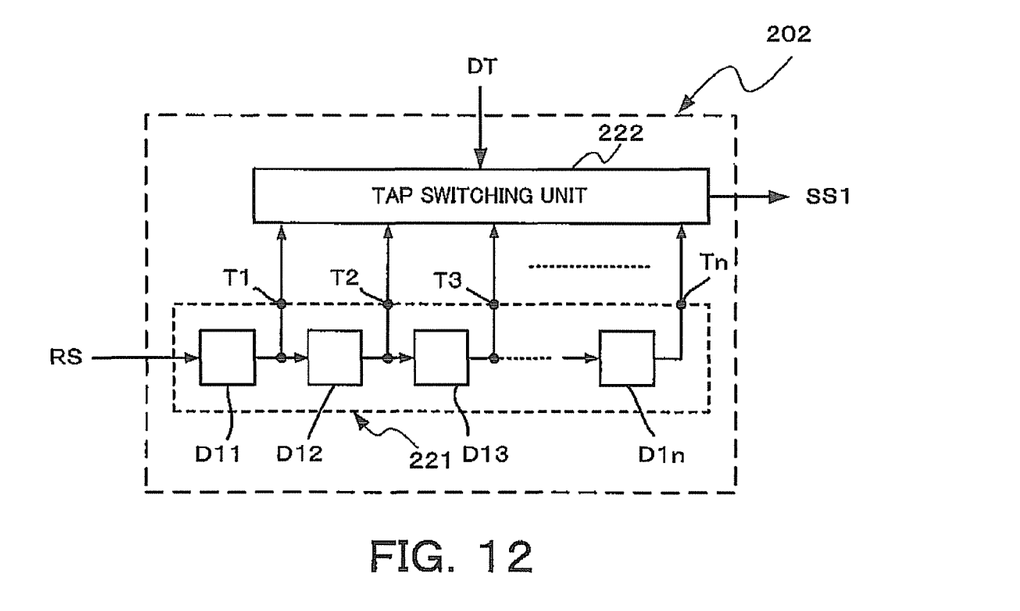
FIG. 12 is a block diagram illustrating an example of a structure of a variable delay unit arranged in the digital converter according to the second embodiment.

FIG. 12 illustrates an example of a structure of the variable delay unit 202.

As shown in FIG. 12, the variable delay unit 202 is provided with a multiple stage delay unit 221 with taps and a tap switching unit 222. The multiple stage delay unit 221 has delay circuits D11 to D1n to delay the excitation signal RS sequentially, and outputs the delayed signals to taps T1 to Tn of the delay circuits D11 to D1n. The tap switching unit 222 switches the taps T1 to Tn to be outputted from the multiple stage delay unit 221 according to the magnitude of the phase delay time DT outputted from the measurement unit 201, and outputs a synchronization signal SS1.

In such a manner, a synchronization signal SS1 is obtained by switching the taps T1 to Tn with the tap switching unit 222. The synchronization signal SS1 can be outputted with delay from the excitation signal RS according to the phase delay time DT.

Even when the phase delay time DT of the output signals S1, S2 with respect to the excitation signal RS is changed under operation of the resolver, such a structure makes it possible to follow the change and to correct the phase of the synchronization signal SS1.

Figure 13:
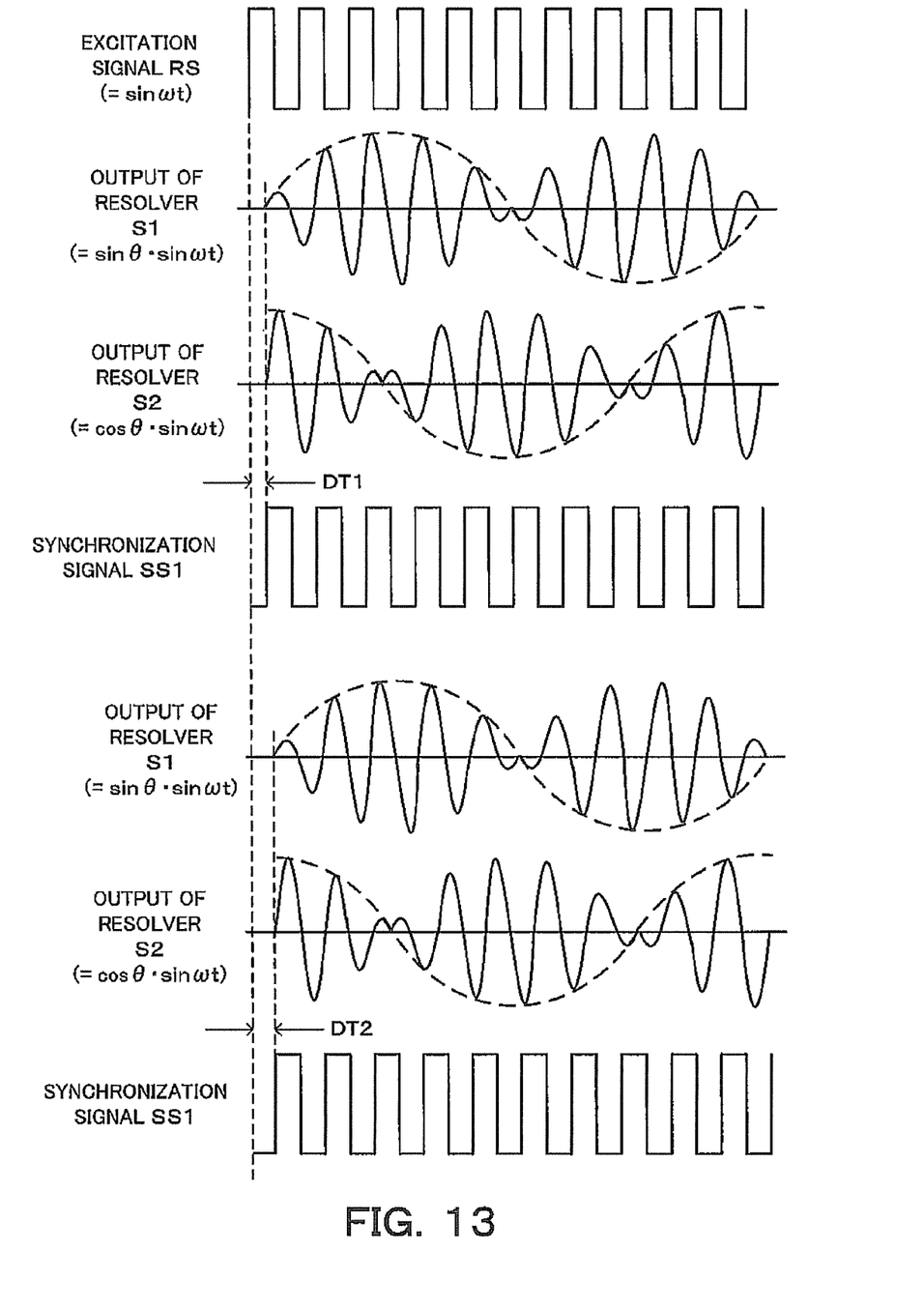
FIG. 13 is a diagram illustrating examples of operation waveforms of the digital converter according to the second embodiment.

FIG. 13 is a diagram illustrating correction of the phase of the synchronization signal SS1 according to the change of the phase delay time DT of the output signals S1, S2 of the resolver. FIG. 13 shows an example where the phase delay time of the output signals S1, S2 of the resolver changes from a period DT1 to a period DT2.

In FIG. 13, when the phase delay time of the output signals S1, S2 of the resolver changes from the period DT1 to the period DT2, following the change of the phase delay time, the phase of the synchronization signal SS1 with respect to the excitation signal RS is corrected.

According to the embodiment, the phase delay time of the output signals S1, S2 of the resolver with respect to the excitation signal RS can be measured under operation of the resolver. The phase of the synchronization signal SS1 to be inputted to the synchronous detection unit 105 can be corrected according to the phase delay time based on the obtained measurement output.

Even when the phase delay time is changed while the resolver operates, the phase of the synchronization signal SS1 can be corrected according to the change of the phase delay time. As a result, the sensitivity of the synchronous detection performed by the synchronous detection unit 105 is not lowered, and the calculation precision of the rotational angle performed by the rotational angle calculation unit 107 is not deteriorated.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the systems described herein may be made without departing from the spirit of the inventions. The accompanying claims and their equivalents are intended to cover such forms or modifications as would fall within the scope and spirit of the inventions.

What is claimed is:

1. A digital converter to process two output signals of a resolver attached to a rotating apparatus, comprising:
    first and second ΔΣ AD converters configured to convert the two output signals into digital signals;
    first and second multiplication units configured to receive the digital signals outputted from the first and second ΔΣ AD converters;
    a subtraction unit configured to subtract outputs of the first and second multiplication units;
    a synchronous detection unit configured to detect the output of the subtraction unit synchronously based on a synchronization signal;
    an angular velocity calculation unit configured to adjust a proportional gain of an output of the synchronous detection unit, to compensate the phase of the output of the synchronous detection unit, and to calculate the angular velocity of the rotating apparatus;
    a rotational angle calculation unit configured to calculate the rotational angle of the rotating apparatus by integrating the angular velocity; and
    a cosine output unit and a sine output unit configured to output a cosine and a sine corresponding to the obtained rotational angle to the first and second multiplication units, respectively.

2. The digital converter according to claim 1, wherein the synchronous detection unit removes an excitation signal component of the resolver included in the outputs of the first and second ΔΣ AD converters.

3. The digital converter according to claim 2, wherein the angular velocity calculation unit includes:
    an integrator unit to integrate the output of the synchronous detection unit;
    a proportional gain adjusting unit to adjust a proportional gain with respect to the output of the synchronous detection unit; and
    an adding unit to add an output of the integrator unit and an output of the proportional gain adjusting unit.

4. The digital converter according to claim 1, wherein the synchronizing signal is generated based on an excitation signal of the resolver.

5. The digital converter according to claim 1, wherein one of the two output signals of the resolver is represented as sin θ·sin ωt and the other of the two output signals of the resolver is represented as cos θ·sin ωt, where θ denotes the rotational angle of the rotating apparatus, and silica denotes an excitation signal of the resolver.

6. The digital converter according to claim 4, wherein the synchronization signal to synchronously detect the output of the subtraction unit is composed of a series of pulses which occur respectively after a constant time period from the zero points of the excitation signal of the resolver.

7. A digital converter to process two output signals of a resolver attached to a rotating apparatus, comprising:
   an excitation signal generation unit configured to generate an excitation signal to be provided to the resolver;
   first and second AD converters configured to convert the two output signals into digital signals, respectively;
   first and second multiplication units configured to receive the digital signals outputted from the first and second AD converters, respectively;
   a subtraction unit configured to subtract outputs of the first and second multiplication units;
   a synchronous detection unit configured to detect the output of the subtraction unit synchronously;
   an angular velocity calculation unit configured to adjust a proportional gain of an output of the synchronous detection unit, to compensate the phase of the output of the synchronous detection unit, and to calculate the angular velocity of the rotating apparatus;
   a rotational angle calculation unit configured to calculate the rotational angle of the rotating apparatus by integrating the angular velocity;
   a cosine output unit and a sine output unit configured to output a cosine and a sine corresponding to the obtained rotational angle to the first and second multiplication units, respectively;
   a measurement unit configured to measure phase delay time of the signals corresponding to the two output signals of the resolver with respect to the excitation signal; and
   a variable delay unit configured to delay the excitation signal according to the phase delay time calculated by the measurement unit, and to input the delayed excitation signal to the synchronous detection unit as a synchronization signal.

8. The digital converter according to claim 7, wherein the first and second AD converters are ΔΣ AD converters.

9. The digital converter according to claim 7, wherein the synchronous detection unit removes an excitation signal component of the resolver included in the outputs of the first and second AD converters.

10. The digital converter according to claim 7, wherein the measurement unit includes:
    a zero point detection unit to detect zero points of the levels of the signals corresponding to the two output signals, and to output a zero point detection signal; and
    a counter to measure a time period from rise of the excitation signal to a time point when the zero point detection signal is outputted.

11. The digital converter according to claim 7, wherein the measurement unit includes:
    first and second zero point detection units to detect zero points of the levels of signals corresponding to the two output signals and to output zero point detection signals, respectively;
    a switch to select and output one of the zero point detection signals of the first and the second zero point detection units; and
    a counter to measure a time period from rise of the excitation signal to a time point when the one of the zero point detection signals is outputted.

12. The digital converter according to claim 7, wherein outputs of the first and second AD converters are inputted to the first and second zero point detection units, respectively.

13. The digital converter according to claim 7, wherein one of the two output signals of the resolver is represented as sin θ·sin ωt and the other of the two output signals of the resolver is represented as cos θ·sin ωt, where θ denotes the rotational angle of the rotating apparatus, t denotes a time, and sin ωt denotes an excitation signal of the resolver.

14. The digital converter according to claim 7, wherein the synchronization signal to synchronously detect the output of the subtraction unit is generated based on the excitation signal of the resolver.

* * * * *